United States Patent
Riho et al.

(10) Patent No.: US 7,796,453 B2
(45) Date of Patent: Sep. 14, 2010

(54) SEMICONDUCTOR DEVICE

(75) Inventors: Yoshiro Riho, Tokyo (JP); Hayato Oishi, Tokyo (JP); Yoshinori Haraguchi, Tokyo (JP); Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 61 days.

(21) Appl. No.: 12/145,240

(22) Filed: Jun. 24, 2008

(65) Prior Publication Data

US 2009/0003107 A1     Jan. 1, 2009

(30) Foreign Application Priority Data

Jun. 29, 2007     (JP)     ............... 2007-171979

(51) Int. Cl.
    *G11C 11/00*     (2006.01)
(52) U.S. Cl. .................. 365/203; 365/230.06
(58) Field of Classification Search ............. 365/203, 365/230.06
    See application file for complete search history.

(56) References Cited

U.S. PATENT DOCUMENTS 5,473,576 A * 12/1995 Matsui ............... 365/230.06
6,262,939 B1 * 7/2001 Matsui ............... 365/233.12
2006/0146623 A1 * 7/2006 Mizuno et al. ............ 365/203

FOREIGN PATENT DOCUMENTS

JP     2006-134469     5/2006

* cited by examiner

*Primary Examiner*—Michael T Tran
(74) *Attorney, Agent, or Firm*—Young & Thompson

(57) ABSTRACT

A semiconductor device includes a column decoder that generates a column selecting signal that selects any of a plurality of bit line pairs to which memory cells are connected according to a column address that is input; a bit line selecting switch that connects by the column selecting signal any of a plurality of bit line pairs and a data I/O line pair that outputs data that has been read from a memory cell to the outside; a data amplifier that amplifies a voltage differential of a data I/O line pair and outputs data that has been read to an output buffer; a data I/O line switch that is provided in the data I/O lines; an I/O line precharge circuit that precharges a data I/O line pair that is not on the side of the data amplifier; and an amplifier precharge circuit that precharges a data I/O line pair that is on the side of the data amplifier.

17 Claims, 12 Drawing Sheets

FIG. 6

PMOS TR. (W=10μm, T=25°C, 1.8V)

|  | CONVENTIONAL PRODUCT | PRESENT INVENTION |
|---|---|---|
| Lg | 0.32μm | 0.38μm |
| Vt (1μA) | 0.48V | 0.29V |
| Ion | 2.09mA | 2.23mA |

FIG. 7

AW MODEL, T=-25°C, VDD=1.6V
tCK(RD)　　　ns

|  | CONVENTIONAL PRODUCT | PRESENT INVENTION |
|---|---|---|
| PREoff | 3.92 | 3.69 |
| TERMINALS OF DATA AMPLIFIER<10mV | 1.71 | 0.83 |
| tCK(DAMP) | 5.63 | 4.52 |

FIG. 8

AW MODEL, T=-25°C, VDD=1.6V
tCK(WR)　　　ns

|  | CONVENTIONAL PRODUCT | PRESENT INVENTION |
|---|---|---|
| YS↓ | 2.22 | 2.22 |
| LIO<10mV | 2.47 | 0.76 |
| tCK(WR) | 4.69 | 2.98 |

SEMICONDUCTOR DEVICE

BACKGROUND OF THE INVENTION

1. Field of the Invention

The present invention relates to a semiconductor device that performs high-speed access by dividing a memory cell array into a plurality of banks in which memory cells mutually operate independently.

Priority is claimed on Japanese Patent Application No. 2007-171979, filed Jun. 29, 2007, the content of which is incorporated herein by reference.

2. Description of Related Art

In recent years, a dynamic random access memory (DRAM) has seen advances in terms of higher capacities, higher speeds, and lower power consumption. In particular, there has been intense demand for higher data transfer speeds, leading to the proposal of new architectures such as double data rate (DDR), DDR-II and DDR-III. Under this environment, shortening the column cycle that determines the operation speed in the memory is a key point for offering high-speed DRAM.

Referring to FIG. 9, the constitution of this kind of DRAM shall be described. FIG. 9 is an example of a block diagram that shows the constitution of a 1-Gbit DDR-II Synchronous Dynamic Random Access Memory (SDRAM). This SDRAM has a known structure including a memory cell array (MCA) 8 which consists of a plurality of memory cells, a row address buffer (XAB), a column address buffer (YAB), a row decoder (XDEC) 6, and a column decoder (YDEC) 5 for specifying addresses of the memory cell array 8, column selecting lines (YS) 7, column selecting switches (YSW) 80, sense amplifiers (SA) for reading and writing data, a main amplifier (MA), an output buffer (DOB), an input buffer (DIB), control signal buffers (RB, CB and WB), and an internal voltage generating circuit (VG). These components are constructed on a single semiconductor chip by the known semiconductor fabrication technology.

In operation, the address signal Ai is supplied from an external source to the DRAM, and the row address buffer XAB and the column address buffer YAB generate a row address signal and a column address signal, respectively. The row address signal and the column address signal are applied respectively to the row decoder 6 and the column decoder 5, which select a desired memory cell in the memory cell array 8.

The column decoder 5 activates the YS signal 7 that is a column selecting line corresponding to the input column address. By turning ON the corresponding column selecting switch 80, the column selecting line 7 that is activated by the column decoder 5 controls the connection of a bit line to a local I/O line (LIO).

In a data reading mode, data is sent through a sense amplifier 20, a local I/O line LIO, a main I/O line MIO, a sub-amplifier, and the main amplifier MA to a read/write bus RWBS, from which output data Dout is output through the output buffer DOB. In the data writing mode, the input data Din is input from an input buffer DIB.

Moreover, control signals for the DRAM include a row address strobe signal RAS, a column address strobe signal CAS, a write enable signal WE and the like that are supplied from an external source through respective buffers RB, CB and WB to the DRAM. Based on the supplied control signals, a control circuit (identical to the control circuit in the present embodiment) generates internal control signals which control operation of internal circuits of the DRAM.

The DRAM has an internal power supply system including an internal voltage generating circuit VG which generates various internal voltage levels including a substrate potential, a step-up power supply potential, and a step-down power supply potential in response to the external power supply potential VDD and the ground potential VSS that are applied from an external source to the internal voltage generating circuit VG The generated internal voltage levels are applied to internal circuits including the memory cell array MCA 8 and peripheral circuits thereof.

FIG. 10 of the accompanying drawing shows a conventional structure of the memory cell array 8 shown in FIG. 9. FIG. 10 shows a circuit arrangement of two mats divided from a single bank. To these mats, there are connected the column selecting line YS 7 from the column decoder 5, mat activating signals (RCSEQB) 50 from the row decoder 6, and sub-word lines SWL. The mat activating signals 50 activate the mats, which are units further dividing a bank. Each of the mat activating signals 50 is connected to an inverter 30 which outputs a signal having a logic level inverted from the mat activating signal 50, as bit line precharging signal (BLEQT) 40. The bit line precharging signal 40 is a control signal for precharging bit lines (BLT and BLB) and controlling common sources in sense amplifiers 201 and 202. For stopping precharging of the bit lines, the bit line precharging signal 40 goes low in level ("L" level).

The sense amplifiers 201 and 202 amplify data that are read to bit lines BLT and BLB. Column selecting switches (YSW) 801 through 804 are provided between the sense amplifiers 201 and 202 and local I/O lines LIO, and are controlled by the column selecting lines YS 7.

Operation of the memory cell array shown in FIG. 10 shall be described below. It is assumed that data is read from a cell in a left-side mat of the two mats shown in FIG. 10.

First, when an ACT command for selecting a row address is input, one mat activating signal RCSEQB 50 is selected from the bank address and the row address (XA), making the mat activating signal high in level ("H" level). The bit line precharging signal BLEQT 40 output from inverter circuit 30 goes low in level, allowing a memory cell signal to be read.

Next, when a READ command is then input, one column selecting line 7 is selected by the column decoder 5. Four column selecting switches 801 through 804 which are connected to the selected column selecting line 7 are then turned ON, and bit line pair BLT and BLB data are amplified by the sense amplifiers 201 and 202 and read to the local I/O lines LIO.

A data input/output line pair IOT and IOB is connected to a data amplifier as shown in FIG. 11. The data that is amplified by this data amplifier is output to an output buffer.

With the memory cell of the conventional semiconductor device shown in FIG. 10, all four column selecting switches 801 through 804 which are connected to one column selecting line 7 are simultaneously activated. Therefore, if the number of mats controlled by one column selecting line 7 increases, the number of column selecting transistors connected to that one column selecting line 7 also increases. For that reason, the burden on the column selecting line 7 increases, and signal delay becomes a problem.

In the conventional semiconductor device described above, the column selecting switches that are connected to one column selecting line are simultaneously activated. In this way, when the bit lines are divided into a greater number of bit lines, the number of column selecting switches that have to be energized by a single column selecting line YS increases. For this reason, the burden on the column selecting line YS further increases, and the signal delay becomes greater.

In order to solve this problem, assuming a constitution of bit lines, local data I/O lines that bundle these bit lines, and data I/O lines that bundle these local data I/O lines, there is a constitution that reduces the number of selecting switches that respectively select them, reduces the burden on the selecting line that controls each selecting switch, and reduces the signal delay amount (for example, refer to Japanese Unexamined Patent Application, First Publication, No. 2006-134469)

The semiconductor device of the abovedescribed JP 2006-134469 A can reduce the signal delay that controls the selecting switches by lowering the load on the selecting line. However, since the precharging of the data I/O lines cannot be performed until outputting from the data amplifier DAMP to the data latch of the next stage, there is the shortcoming of a delay occurring in the reading of data.

That is, in the conventional example described above, in the constitution in which each bit line, local I/O lines and data I/O lines are connected as shown in FIG. 10, and the data I/O line and data amplifier are connected as shown in FIG. 11, it is necessary to perform precharging of the data I/O line and the data amplifier simultaneously as shown in FIG. 12. However, in the state of outputting data to the output buffer 75, it is not possible to perform precharging of the data I/O line that has already completed the process of transmitting data to the data amplifier. Therefore, precharging of the data I/O line pair 60 and the data amplifier 70 are performed with a signal that deactivates the data amplifier 70. For this reason, precharge processing of the data I/O line pair 60 for reading the next data is delayed, and the speeding up of the read cycle is limited.

In recent years, even in a semiconductor device of low power driving, improvement of the data transfer rate has been desired.

As the bit number configuration that is the data-read unit in a semiconductor device has increased from ×16 to ×32 to ×64, the spread in operation speed of the precharge of data I/O lines has become two times, four times, eight times. Due to setting the precharge time at the slowest precharge rate, this spread affects the data read operation speed.

As shown in the timing chart of FIG. 12, in the case of the precharge of the data I/O line not finishing even if the data amplifier is enabled, amplification of the differential voltage of the data I/O line pair is performed in the data amplifier prior to the precharging completely finishing due to the delay of the precharge operation of this data I/O line. For this reason, due to a reduction in the differential voltage of the data I/O line pair during driving of the data amplifier, a speed reduction in the amplification operation of the data amplifier results, serving as a cause of rate limit of the data read clock cycle.

Moreover, due to the differential voltage of the I/O data line pair prior to precharge, the previous differential voltage is not completely dissolved, and so may lead to a malfunction of outputting data that differs from the actual data.

FIG. 13 shows a circuit configuration of the writing amplifier. FIG. 14 shows the timing chart during writing of data. Prior to the state of the write amplifier being enabled, precharge of the data I/O line is performed. Similarly to in the read mode, at the point in which the write amplifier has been enabled, precharging has not been completely completed, which may cause a reduction in the writing sneed.

Y switching signals YS0, YS1, YS2, and YS3 that turn the Y switch YSW 80 ON/OFF are output from a control circuit not illustrated in sequence based on an external clock CLK that is supplied from an external source, and a CASB and column address. The speed of the read operation and write operation are determined by the abovementioned external clock CLK.

In order to solve the abovementioned problem, there is known a method of reducing the precharge time of the data I/O line by increasing the voltage of the power supply for precharging and raising the precharge current. However, since low power consumption of the semiconductor device is required, a means of increasing consumption current is not adopted.

SUMMARY OF THE INVENTION

The present invention was achieved in view of the above circumstances, and has as its object to provide a semiconductor device that increases the precharge speed of data I/O lines or data amplifier without increasing the consumption current, and increases the speed of reading data from memory and the speed of writing data to memory.

The semiconductor device of the present invention has a data amplifier that amplifies a voltage differential of a data I/O line pair and outputs data that has been read to an output buffer; a data I/O line switch that controls connection and disconnection between the data I/O line pair and the data amplifier; an I/O line precharge circuit that precharges a first portion of the data data I/O line pair, wherein, the first portion of the data I/O line pair is separated by the data I/O line switch and located not on the side of the data amplifier; and an amplifier precharge circuit that precharges a second portion of the data I/O line pair, wherein the second portion of the data I/O line pair is separated by the data I/O line switch and located on the side of the data amplifier.

In addition, the semiconductor device of the present invention may be further provided with a column decoder that generates a column selecting signal that selects a bit line pair from among a plurality of bit line pairs to which memory cells are connected according to a column address that is input; and a bit line selecting switch that connects, according to the column selecting signal, the bit line pair of a plurality of the bit line pairs and a data I/O line pair that outputs data from a memory cell to the outside.

In the semiconductor device of the present invention, during the data reading period, the I/O line precharge circuit may perform precharging of the first portion of the data I/O line pair when both of the bit line selecting switch and the data I/O line switch are in the OFF state.

In the semiconductor device of the present invention, during the data reading period, the amplifier precharge circuit may perform precharging of the second portion of the data I/O line pair when the data I/O line switch is in the OFF state, and the bit line selecting switch is in the ON state.

The semiconductor device of the present invention may additionally has a write amplifier for amplifying input data to be written to the memory, that is connected to the second portion of the data I/O line pair, and during the data writing period, the I/O line precharge circuit may perform precharging of the first portion of the data I/O line pair when the write amplifier is in the enabled state, and the data I/O line switch is in the OFF state.

In the semiconductor device of the present invention, in the I/O line precharge circuit, a threshold voltage of a transistor that precharges the first portion of the data U/O line pair may be set low compared to a threshold voltage of a transistor of the data I/O line switch.

In the semiconductor device of the present invention, in the amplifier precharge circuit, a threshold voltage of a transistor that precharges the second portion of the data I/O line pair may be set low compared to a threshold voltage of a transistor of the data I/O line switch.

In the semiconductor device of the present invention, the precharge voltage that is precharged by the I/O line precharge circuit or the amplifier precharge circuit may be set low compared to the power supply voltage that is supplied from outside.

BRIEF DESCRIPTION OF THE DRAWINGS

FIG. 6 is a table that shows a comparison of properties of the p-channel type MOS transistor in the embodiment and a conventional example.

FIG. 7 is a table that shows a comparison of the read cycle tCK (RD) in the embodiment and the conventional example.

FIG. 8 is a table that shows a comparison of the write cycle tCK (WR) in the embodiment and the conventional example.

DETAILED DESCRIPTION OF THE INVENTION

Figure 1:
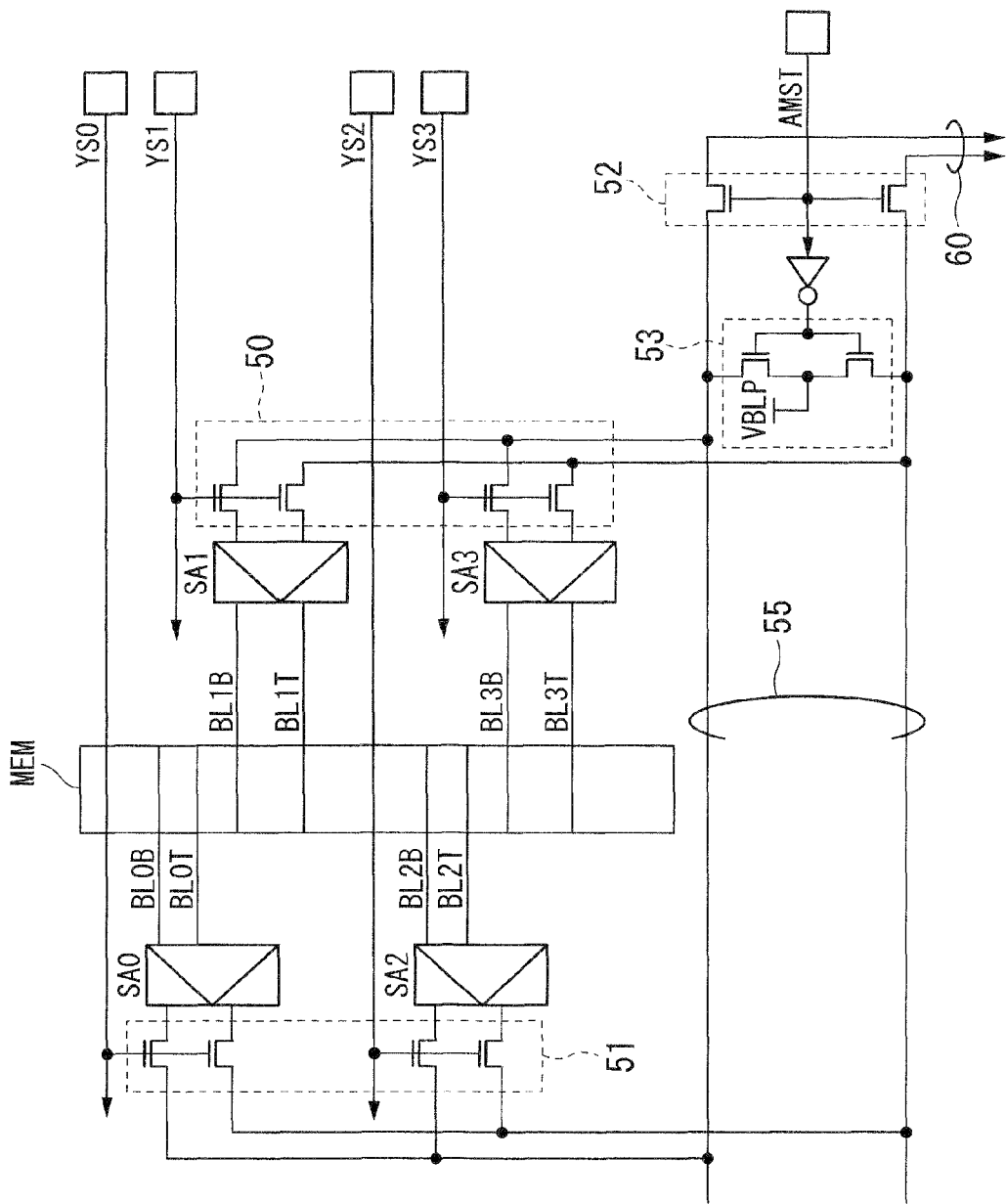
FIG. 1 is a block diagram that shows a configuration example of the bit lines, the local I/O lines, and the data I/O lines in the semiconductor device according to an embodiment of the present invention.
Figure 9:
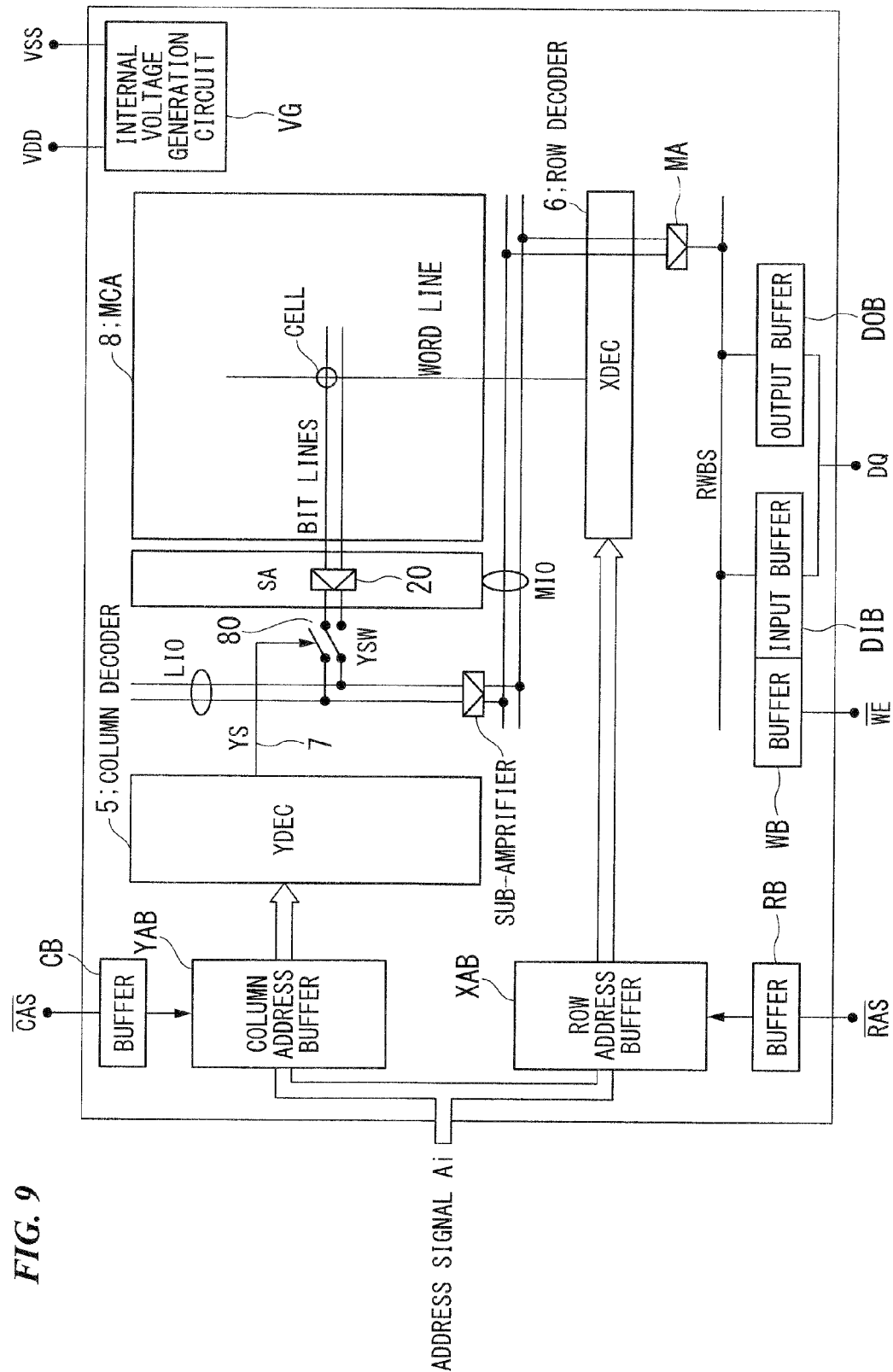
FIG. 9 is a block diagram that shows a memory cell array on a semiconductor chip of a semiconductor device and a configuration example of performing reading/writing of data to the memory cell array.
Figure 10:
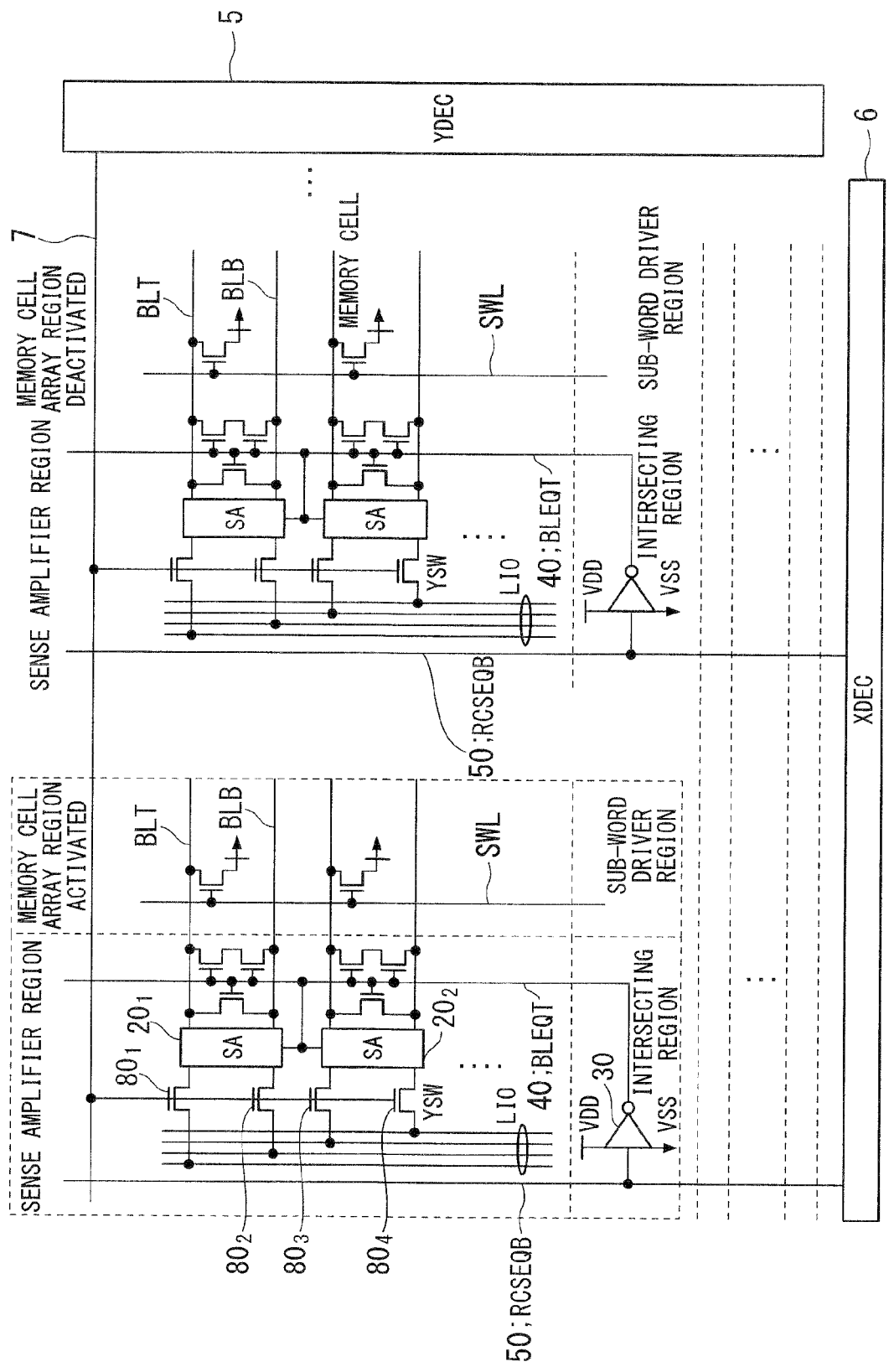
FIG. 10 is a conceptual diagram that shows the circuit of a conventional memory cell region.
Figure 11:
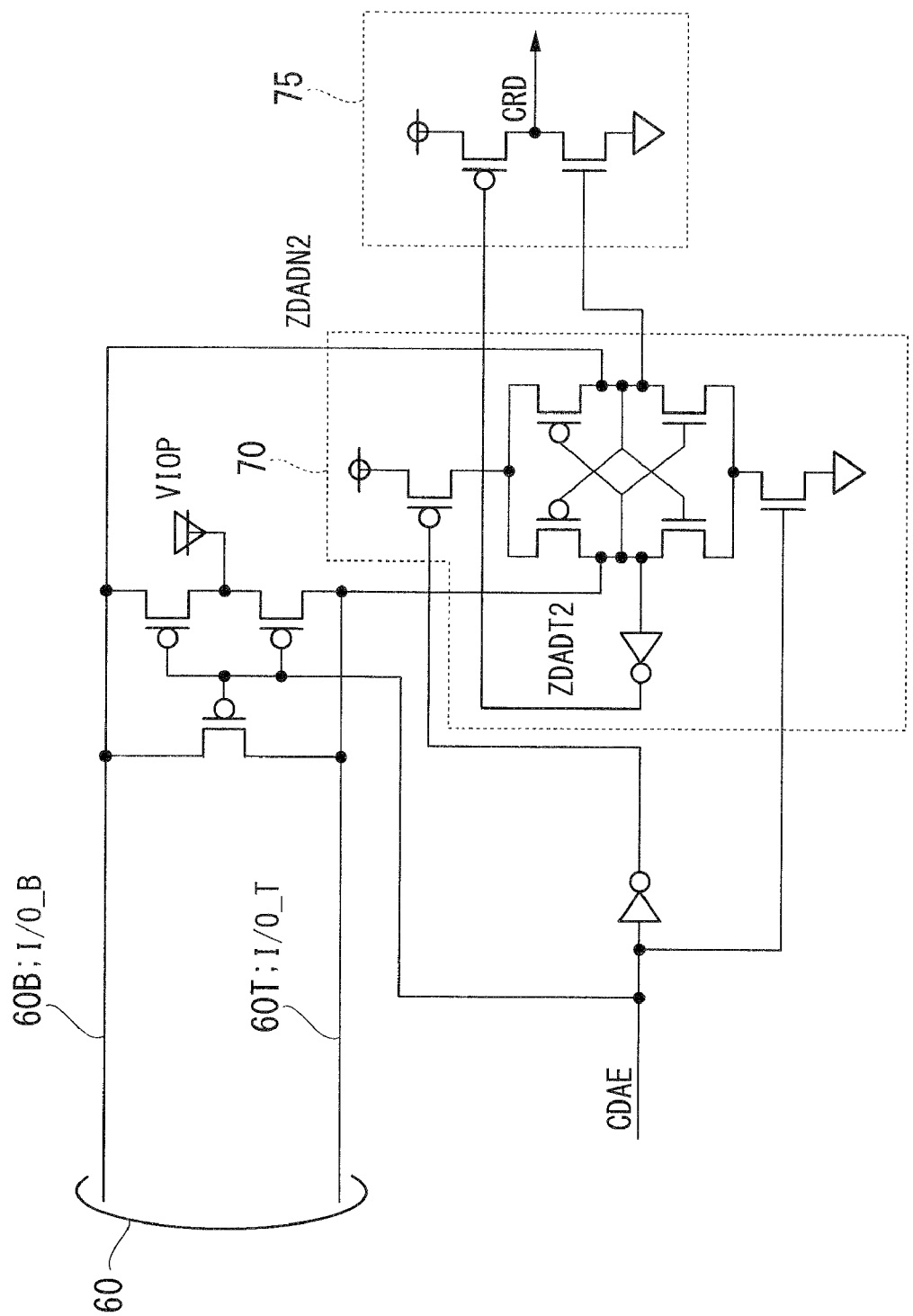
FIG. 11 is a circuit diagram that shows the configuration of the data I/O lines and the data amplifier in a conventional semiconductor device.
Figure 12:
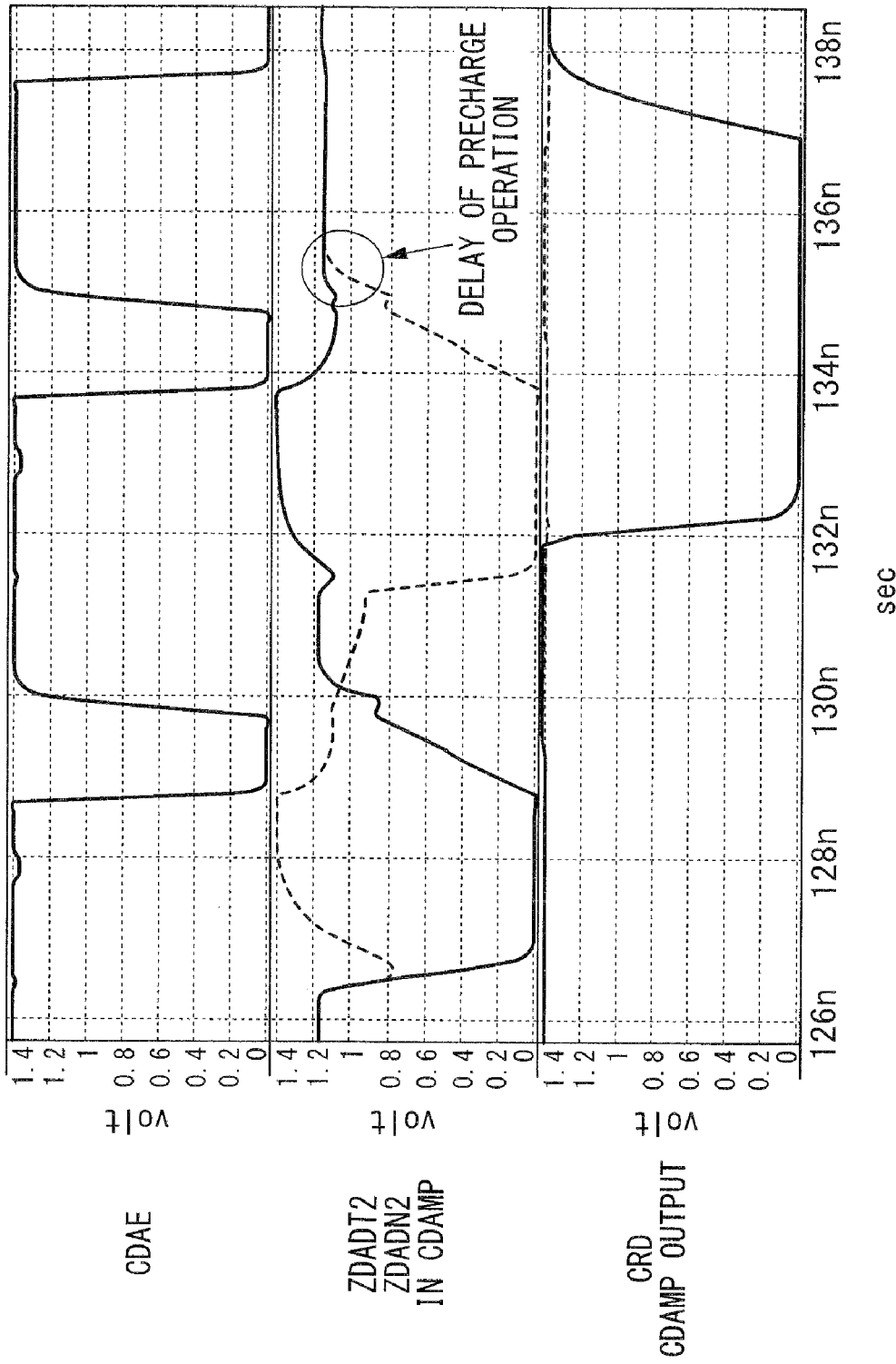
FIG. 12 is a timing chart that shows an operational example of the circuit shown in FIG. 11 during reading.
Figure 13:
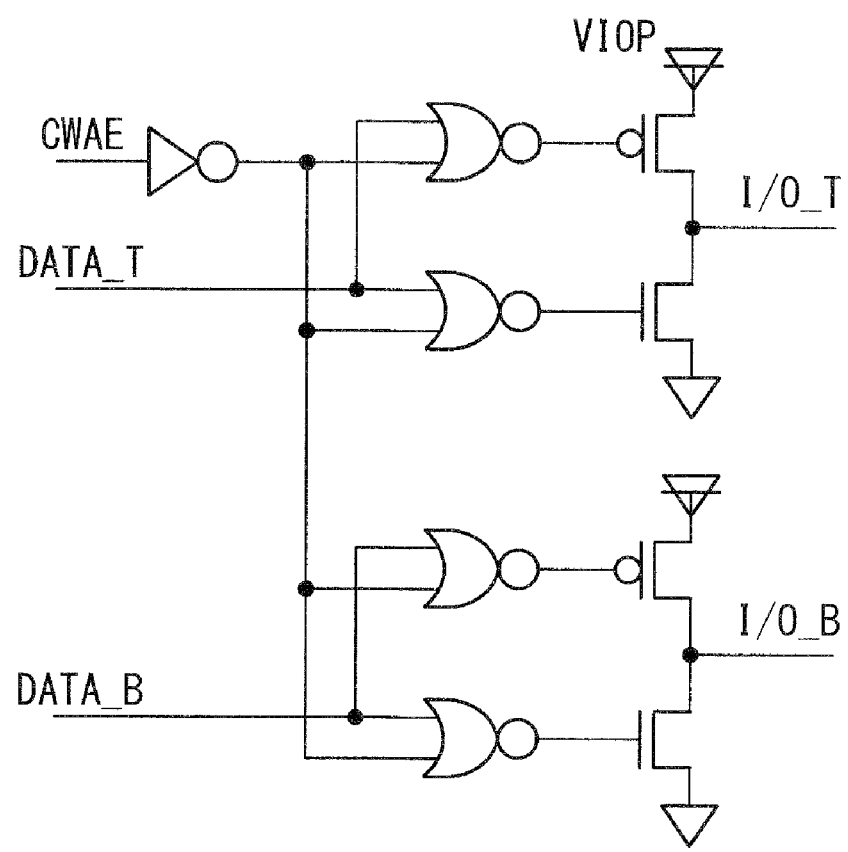
FIG. 13 is a circuit diagram that shows the configuration of the data I/O lines and the write amplifier in the semiconductor device of a conventional example.
Figure 14:
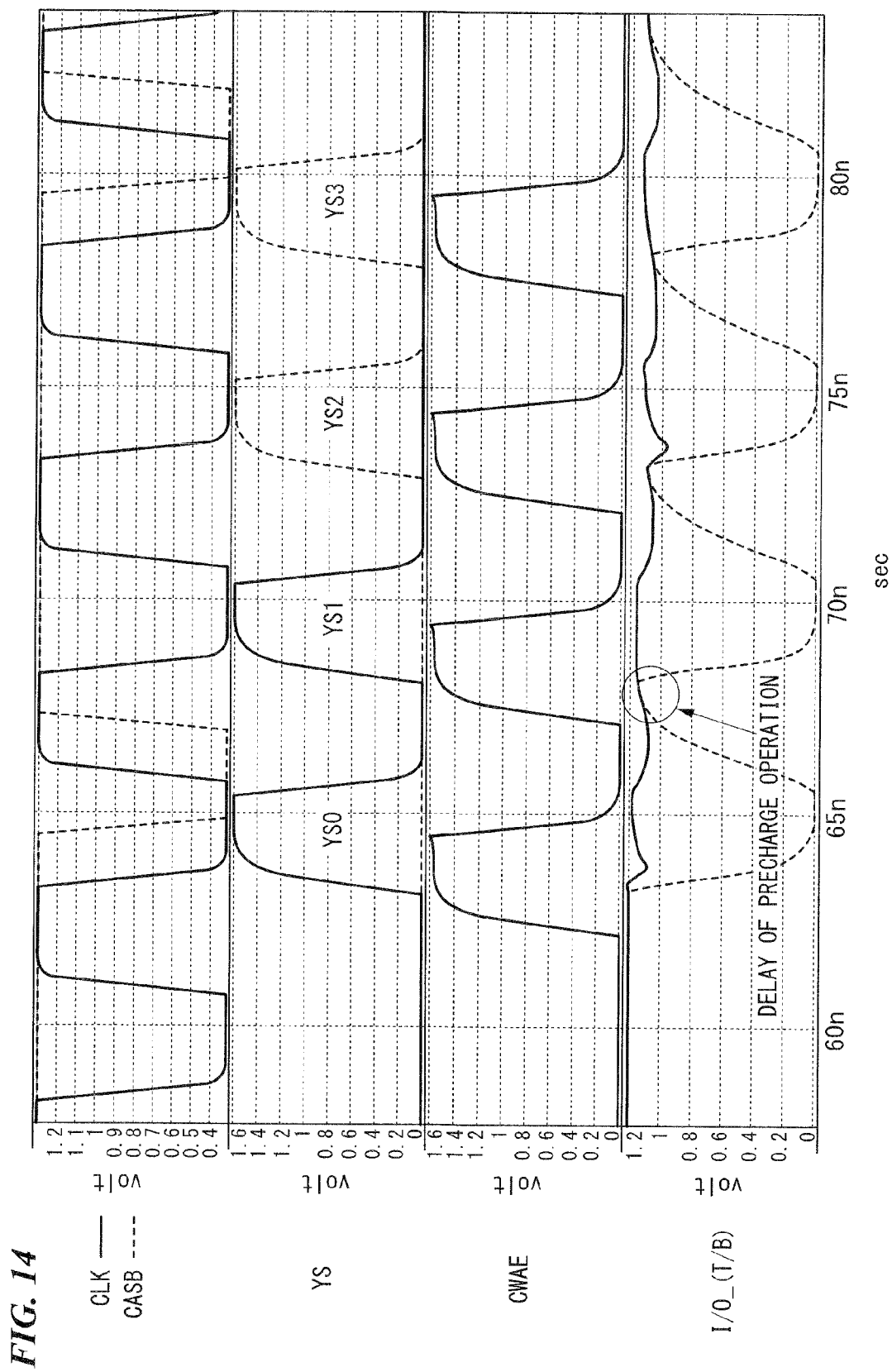
FIG. 14 is a timing chart that shows an operational example of the circuit shown in FIG. 13 during writing.

An embodiment of the present invention will be described hereinbelow with reference to the drawings. The overall constitution of the semiconductor device is the same as that illustrated in FIG. 9 that has already described. FIG. 1 is a block diagram that shows a configuration example of a memory cell array in an embodiment of the present invention.

In the drawing, a memory region MEM is connected to each bit line pair. A bit line pair BL1T and BL1B is connected to a sense amplifier SA1. A bit line pair BL3T and BL3B is connected to a sense amplifier SA3. A bit line pair BL0T and BL0B is connected to a sense amplifier SA0. A bit line pair BL2T and BL2B is connected to a sense amplifier SA2.

Any of the aforementioned plurality of bit line pairs connects to a local I/O line pair 55 by bit line selecting switches 50 and 51 (for example, a Y switch that is a column selecting switch that is constituted by an n-channel type MOS transistor). A precharge circuit 53 that performs precharging of the local I/O lines is provided in the local I/O line pair. The bit line selecting switches 50 and 51 are controlled by the column selecting lines YS0 to YS4. YS0 to YS4 signals are generated by a column decoder from column addresses that are input.

A local I/O line selecting switch 52 (for example, constituted by an n-channel type MOS transistor) that connects any of the plurality of local I/O line pairs 55 to a data I/O line pair 60 is provided. A signal AMST that selects the local I/O line pair 55 is a mat activation signal that performs selection of a mat selection, and is generated by a row decoder from a row address that is input. Here, a mat refers to a memory cell region that divides a bank into a plurality of regions using one portion of a row address.

Figure 2:
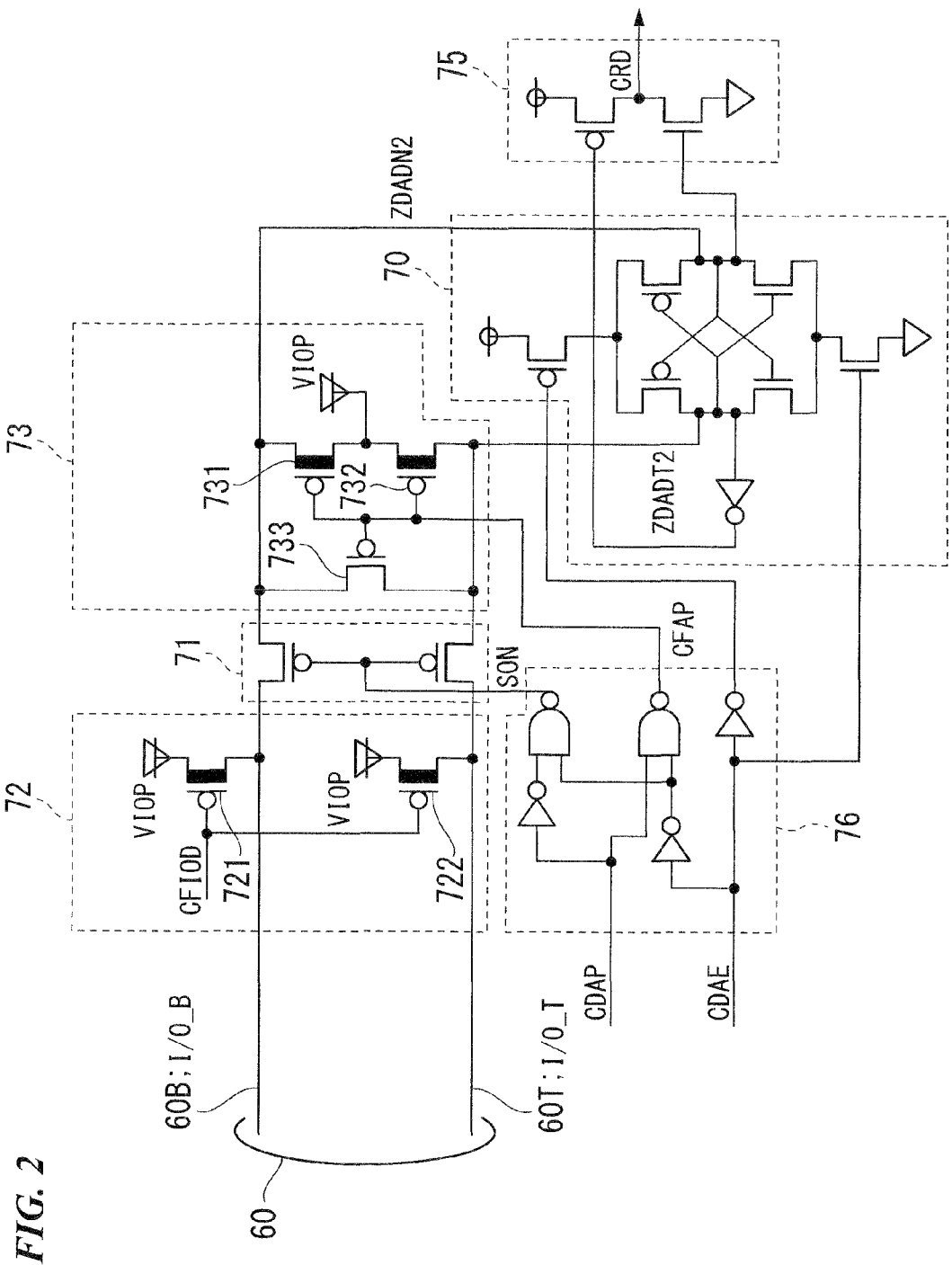
FIG. 2 is a circuit diagram that shows the configuration of the data I/O lines and the data amplifier in the semiconductor device according to the embodiment of the present invention.

Next, the circuit constitution of the data I/O lines and the data amplifier in the embodiment will be described with reference to FIG. 2. FIG. 2 is a circuit diagram that shows the connection constitution of the data I/O lines and the data amplifier of FIG. 1 according to the embodiment.

Data I/O lines include a data I/O line pair 60 (first portion) and a data I/O line pair (second portion) on the side of a data amplifier that is connected to the data amplifier side by a data I/O line switch 71. The constitution can connect the data I/O line pair 60 and the data I/O line pair on the side of the data amplifier 70 when transmitting data to the data amplifier 70 from the data I/O line pair 60 through the data I/O line pair on the side of the data amplifier, and can separate them at other times.

Regarding a data I/O line 60T and a data I/O line 60B, a precharge circuit 72 is provided that performs precharging of the data I/O line pair 60. On the other hand, an amplifier precharge circuit 73 that precharges the data I/O line pair on the side of the data amplifier 70 in conjunction with the data I/O line switch 71 is provided on the data I/O line pair of the side of the data amplifier 70.

With this constitution, by putting the data I/O line switch 71 in an OFF state, it is possible to independently precharge the data I/O line pair 60 and the data I/O line pair on the side of the data amplifier 70 at separate timings.

Accordingly, precharging of the data I/O line pair on the side of the data amplifier 70 is performed while transmitting data from the bit line pair to the data I/O line pair 60. After transmitting data from the data I/O line pair 60 to the data amplifier 70, the operation of performing precharging of this data I/O line pair 60 is repeated. By this operation, the start timing of the precharge of this data I/O line pair 60 can be comparatively faster than that of the conventional art, and therefore, it is possible to increase the overall speed of reading data.

A switch control circuit 76 generates a precharge signal CFAP that activates the amplifier precharge circuit 73 that performs precharge of the data I/O line pair on the side of the data amplifier 70 and generates a control signal SON that controls the ON/OFF control of the data line I/O switch 71 with a precharge signal CDAP and a control signal CDAE.

The switch control circuit 76 outputs a control signal SON that puts the data line I/O switch 71 in the ON state only when the precharge signal CDAP and the control signal CDAE are both at the "L" level. The switch control circuit 76 outputs the precharge signal CFAP that activates the amplifier precharge circuit 73 only when the precharge signal CDAP is at the "H" level and the control signal CDAE is at the "L" level.

The I/O line precharge circuit 72 is constituted by p-channel type MOS transistors (hereinbelow referred to as a p-type transistor) 721 and 722. The threshold voltage of these p-type transistors 721 and 722 is set low compared to the p-type transistors that constitute other circuits than the I/O line precharge circuit 72, for example, the data I/O line switch 71.

By making the power supply voltage that is supplied from outside the step-down power supply voltage, the voltage VIOP for precharging is lowered compared to the conventional art. Thereby, by reducing the charge/discharge current in precharging of the data I/C line, it is possible to reduce the consumption current.

At the transition stage in which the precharge signal CFIOD changes to the "L" level, since the threshold voltage is set low even if the precharge voltage VIOP is reduced, it is put in an ON state at an earlier timing compared to other p-type transistors. For this reason, the precharge is started at a high speed and the precharge current also increases. That is, even if the voltage VIOP for precharge is not increased, it is possible to perform precharge of the data I/O line pair 60 at a high speed compared to the conventional art.

Simultaneously, the amplifier precharge circuit 73 is constituted by p-type transistors 731, 732, and 733. The threshold voltage of these p-type transistors 731 and 732 is set low compared to the p-type transistors that constitute other circuits than the amplifier precharge circuit 73, for example, the data I/O line switch 71. Since it only has an equalizing function, the threshold voltage of the p-type transistor 733 is set to the same threshold voltage as the p-type transistor that constitutes the data I/O line switch 71.

Figure 3:
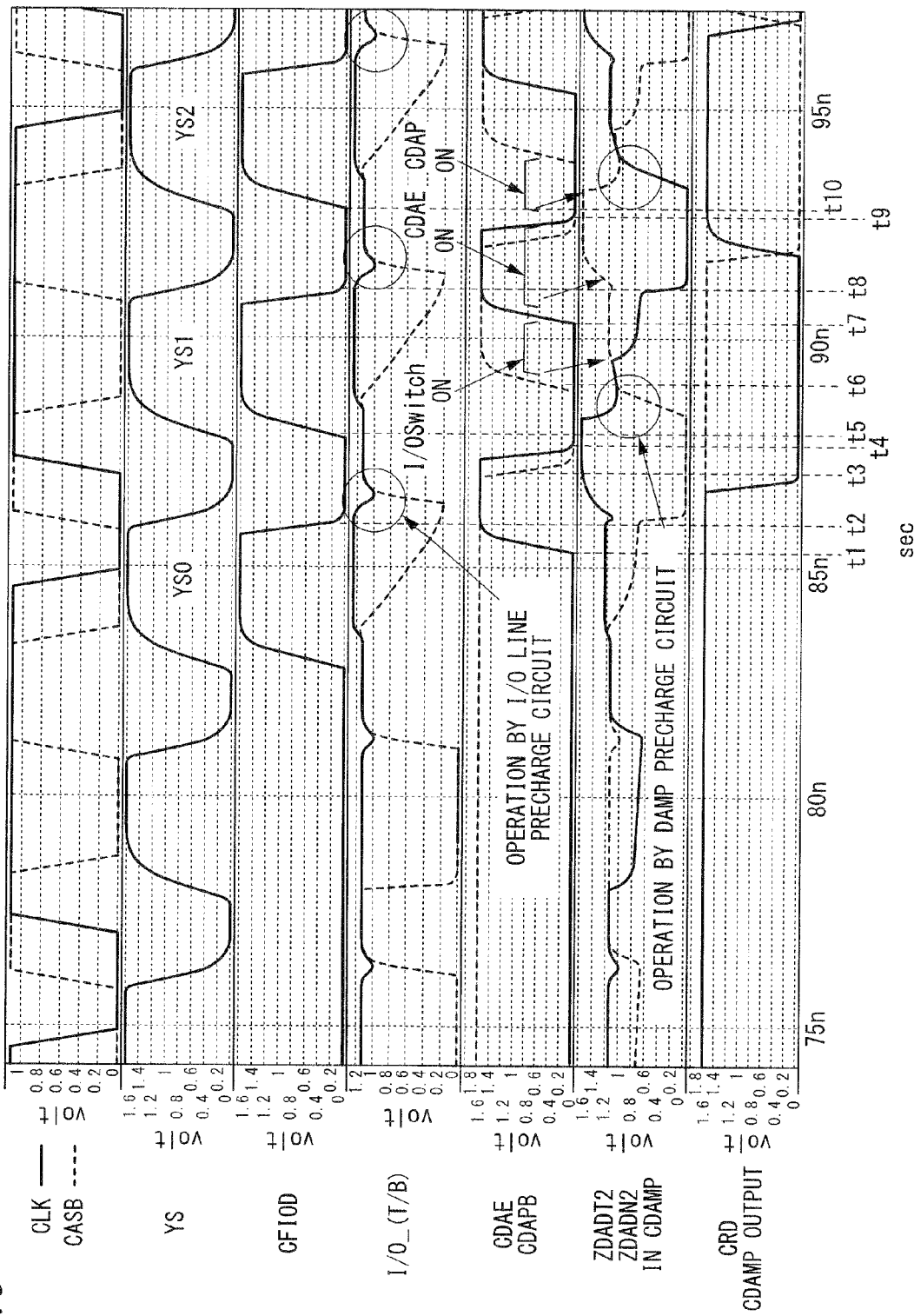
FIG. 3 is a timing chart that shows an operational example of the circuit shown in FIG. 2 in the reading mode.

Thereby, when the precharge signal CFAP is at the "L" level, precharging is started at a high speed comnpred to other transistors, and the precharge current also increases even if the voltage VIOP for precharge is not increased. That is, it is possible to perform precharting of the data I/O line pair on the side of the data amplifier 70 at a high speed compared to the conventional art Next, the operation of the process of reading data from memory cells in the present embodiment will be described with reference to FIG. 2 and FIG. 3. FIG. 3 is a timing chart obtained from simulation, and shows an operation example of the process of reading data from a memory cell in the present embodiment.

Here, a control circuit (not shown) generates a precharge signal CFIOD, a data amplifier precharge signal CDAP, and control signal CDAE that starts (activates) the data amplifier by a row address strobe signal RAS, a column address strobe signal CAS (CASB in FIG. 3), and a write enable signal WE that are control signals, a column address and row address, and an external clock CLK.

A YS signal is generated in the control circuit by the column address strobe signal CAS and the external clock CLK. The operation speed of the semiconductor device is determined by this external clock CLK. Immediately before a time t1 described below, the precharge signal CFIOD is at the "H" level, and the precharge signal CDAPB (the inversion signal of the aforementioned precharge signal CDAP) is at the "H" level, and the control signal CDAE is at the "L" level. At this time, the data I/O switch 71 is in the OFF state. Hereinbelow, each time the external clock CLK is input, the control circuit outputs YS signals YS0, YS1, YS2 and YS3 corresponding to the column address.

At time t1, the abovementioned control circuit shifts the control signal CDAE from the "L" level to the "H" level. The data amplifier 70 is activated, and data is output from the data amplifier 70 to the output buffer 75. Thereby, the output buffer 75 outputs the data that has been input from the data amplifier 70 as output data CRD to a data input/output pad.

At time t2, the control circuit shifts the precharge signal CFIOD from the "H" level to the "L" level. Each p-type transistor of the I/O line precharge circuit 72 enters the ON state, and precharging of the data I/O line pair 60 is started.

At time t3, the control circuit shifts the precharge signal CDAPB from the "H" level to the "L" level. Thereby, the precharge signal CEA changes from the "H" level to the "L" level. Each p-type transistor of the amplifier precharge circuit 73 is put in an ON state, and the precharging is commenced on the data I/O line pair on the side of the data amplifier 70.

At time t4, the control circuit shifts the control signal CDAE from the "H" level to the "L" level. Thereby, the data amplifier 70 is deactivated.

At time t5, the control circuit shifts the precharge signal CFIOD from the "L" level to the "H" level. Each p-type transistor of the I/O line precharge circuit 72 enters the OFF state, and the precharge operation of the data I/O line pair 60 ends. In the design stage, this precharge time is set in advance to the time of becoming the precharge voltage. At this time, the data that is read from the memory cell is transmitted to the data I/O line pair 60 from any bit line via the local I/O line 55.

At time t6, the control circuit shifts the precharge signal CDAPB from the "L" level to the "H" level. That is, the precharge signal CDAP is shifted from the "H" level to the "L" level. Thereby, each p-type transistor of the amplifier precharge circuit 73 is put in an OFF state, and the precharging of the data I/O line pair on the side of the data amplifier 70 ends.

Since the data I/O line switch 71 shifts from the OFF state to the ON state, the data I/O line pair 60 and the data I/O line pair on the side of the data amplifier 70 are connected via the data I/O line switch 71, and the data of the data I/O line pair 60 are transmitted to the data amplifier 70.

At time t7, the control circuit shifts the control signal CDAE from the "L" level to the "H" level. Thereby, since the data I/O line switch 71 shifts from the ON state to the OFF state, the data I/O line pair 60 and the data I/O line pair on the side of the data amplifier 70 are separated.

The control signal CDAE goes to the "H" level, and thereby the data amplifier 70 enters the active state. Thereby, at time t6, amplification processing is performing on the voltage differential of the data that is transmitted from the data I/O line pair 60, and the result is output to the output buffer 75.

At time t8, the control circuit shifts the precharge signal CFIOD from the "H" level to the "L" level. Each data I/O line 60T and 60B of the data I/O line pair 60 is precharged. At this point, the data amplifier 70 is in a state of outputting data that is amplified to the output buffer 75.

At time t9, the control circuit shifts the control signal CDAE from the "H" level to the "L" level as stated at time t4. Thereby, the data amplifier 70 is deactivated, and precharging of the data I/O line pair on the side of the data amplifier 70 is performed.

At time t10, the control circuit shifts the precharge signal CFIOD from the "L" level to the "H" level. Precharging of each data I/O line 60T and 60B of the data I/O line pair 60 ends.

The subsequent operations are a repetition of time t4 to time t10, and so the explanation thereof shall be omitted.

Figure 4:
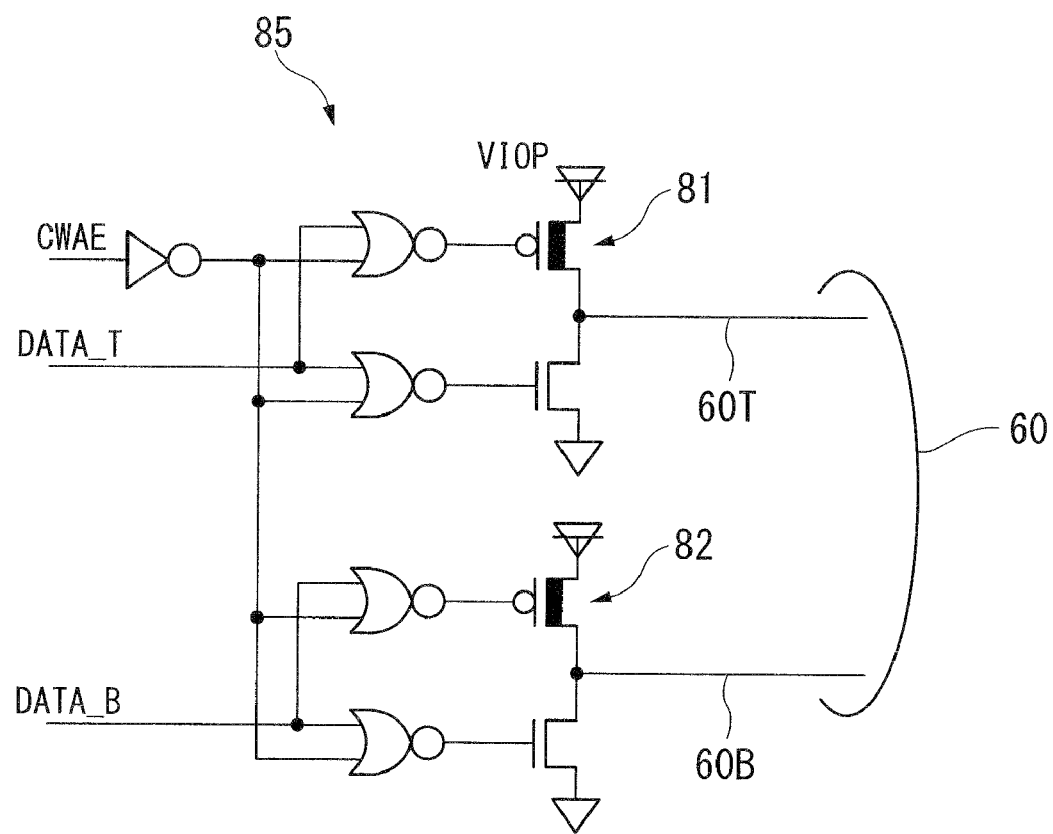
FIG. 4 is a timing chart that shows the configuration of the data I/O lines and the write amplifier in the semiconductor device according to the embodiment of the present invention.

Next, the circuit configuration of the data I/O lines and the write amplifier in the present embodiment shall be described with reference to FIG. 4. FIG. 4 is a circuit diagram that shows the connection configuration of the data I/O lines of FIG. 1 in the embodiment and the write amplifier.

In this write amplifier 85, it is necessary to perform precharging of the data I/O line pair 60 prior to transmitting the data to be written from an external source to the memory cell to the data I/O lines. In order to increase the write cycle speed similarly to the case in the data amplifier 70, it is necessary to reduce the precharge process time on the data I/O line pair 60. For that reason, in the abovementioned write amplifier 85, p-type transistors 81 and 82 that perform precharging on the data I/O line pair 60 are set to the same low threshold voltage as the p-type transistors 721, 722, and 723 already described.

Figure 5:
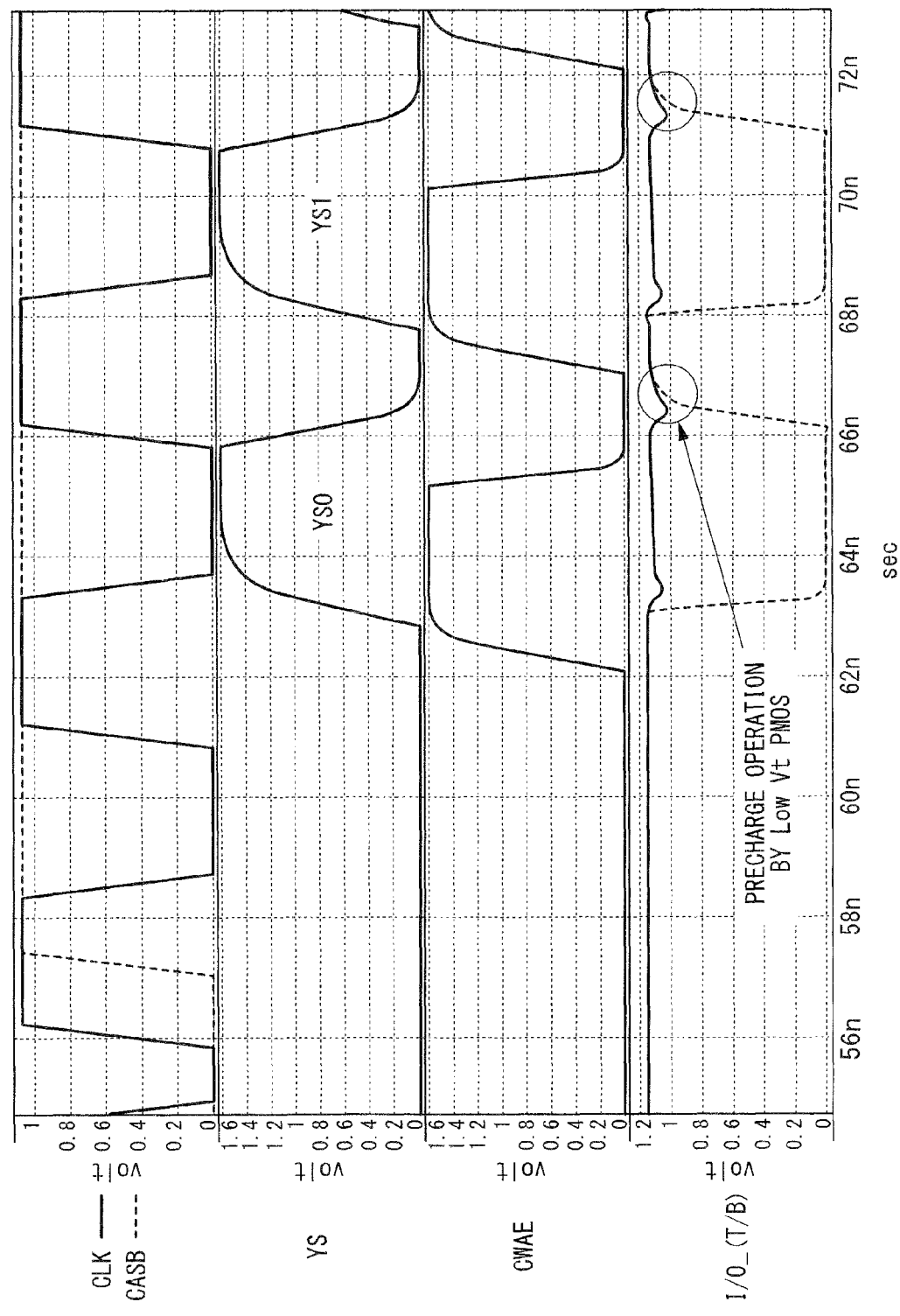
FIG. 5 is a timing chart that shows an operational example of the circuit shown in FIG. 4 in the writing mode.

Next, the operation of the process of writing data to the memory cell in the embodiment will be described with reference to FIG. 5. FIG. 5 is a timing chart obtained from simulation, and shows an operation example of the write amplifier. As will be evident, when a control signal CWAE that activates the write amplifier 85 changes from the "H" level to the "L" level, and the write amplifier 85 is deactivated, the period in which the data I/O lines becomes the precharge voltage is shortened compared to the conventional art.

As shown in FIG. 5, a YS signal that controls the Y switch that selects the bit line in a control circuit is generated according to the column address strobe signal CAS and the external clock CLK. The operation speed of the semiconductor device is determined by this external clock CLK. Hereinbelow, each time the external clock CLK is input, the control circuit outputs YS signals YS0, YS1, YS2 and YS3 corresponding to the column address. Similarly, the control signal CWAE that puts the write amplifier in the enabled state is output from the control circuit.

The threshold voltage of the p-type transistor that is used for precharging is set low. Therefore, at the transition stage in which the control signal CWAE changes from the "H" level to the "L" level, it enters the ON state at an earlier timing than a p-type transistor of a normal threshold voltage. For this reason, it is possible to start the precharge of the data I/O line pair 60 early. Moreover, since the threshold voltage is reduced, the ON resistance is also reduced, and so it is possible to perform high-speed precharging, and possible to increase the speed of the write cycle.

In the abovedescribed embodiment, it is possible to set the precharge voltage VIOP that is used in precharging with respect to the power supply voltage from an external source by the same amount of lowering the threshold voltage of the p-type transistor. Thereby, it is possible to reduce the charge/discharge current in precharging of the data I/O line, and it is possible to reduce the consumption current. Accordingly, in the embodiment, due to the fact that it is possible to quicken the timing of precharging of the data I/O lines by independently performing precharging of the data I/O line pair and precharging of the data I/O line pair on the side of the data amplifier 70, it is possible to realize a speeding up of the read cycle. Moreover, since the threshold voltage of the p-type transistor that performs the precharging is lowered, it becomes possible to shorten the precharge period, and so even when the voltage that is used in precharging is lowered compared to before, it is possible to sufficiently increase the speed of writing and reading data.

FIG. 6 is a table that shows the electrical characteristics of the characteristics of a p-type transistor that is generally used in conventional circuits or circuits of the embodiment and the characteristics of the p-type transistor of the low-threshold voltage compared with them. As measurement conditions, the transistor width W=10 μm, the temperature T=25° C., and the power supply voltage=1.8V.

The gate length Lg of an ordinary p-type transistor in the present embodiment is 0.32 μm, while that of a p-type transistor with a low threshold voltage is 0.38 μm. The threshold voltage of an ordinary p-type transistor in the present embodiment is 0.48 V, while that of a p-type transistor with a low threshold voltage is 0.29 V The ON current of a typical p-type transistor in the present embodiment is 2.09 mA, while that of a p-type transistor with a low threshold voltage is 2.23 mA.

Next, FIG. 7 is a table that shows a comparison of the read cycle tCK (RD) of a conventional product and the embodiment. As the measurement conditions, the temperature T is −25° C., and the power supply voltage is 1.6V.

PREoff shows the time during which precharging of the data I/O line is not performed. Since precharging of the data I/O line and the data I/O line pair on the side of the data amplifier 70 are performed independently, it is shown that the period in the embodiment is shorter compared to a conventional product.

"Terminals of data amplifier <10 mV" shows the time of the electric potential difference between the terminal ZDADT2 and the terminal ZDADN2 that are connected to the data I/O line pair on the data amplifier 70 side is less than 10 mV. Since the threshold voltage of the p-type transistor that performs precharging is lowered, it is shown to be speeded up compared to a conventional product.

The time of adding the PREoff time and the time of the "terminals of data amplifier <10 mV" becomes the read cycle time tCK (DAMP). That is, it is shown that the read cycle of the present invention has been speeded up.

Next, FIG. 8 shows a comparison of the write cycle tCK (WR) of the conventional product and the embodiment.

"YS↓" indicates the pulse width of the YS signal, with this value being the same for both the conventional product and the embodiment.

"LIO <10 mV" shows the time in which the electric potential difference of the data I/O lines 60T and 60B in the data I/O line pair is less than 10 mV after the YS signal changes from the "H" level to the "L" level. Because the threshold voltage of the p-type transistor that nerforms precharging has been lowered it is shown to be speeded up compared to the conventional product.

As described above, according to the present invention, assuming one data I/O line pair and another data I/O line pair that is connected to the side of a data amplifier as a data I/O line pair, due to the fact that a data I/O line switch is provided between the one data I/O line pair and the another data I/O line pair, it is possible to separately provide the precharge circuit of the one data I/O line pair and the precharge circuit of the other data I/O line pair. In the read mode, prior to the precharging of the other data I/O line pair on the data amplifier side being completed, it is possible to read data from the bit line with respect to the one data I/O line pair, and so possible to increase the speed of reading data.

Moreover, according to the embodiment of the present invention, at the point in which the data amplifier outputs the data to the output buffer, it is possible to partially start the precharge of the data I/O line. In the reading mode, since it is possible to perform the precharge of the data I/O line for reading the next data from the bit line before the data output ends, it is possible to increase the speed of reading data.

That is, according to the embodiment of the present invention, it is possible to independently perform the required operation for the next reading in advance, and possible to increase the speed of reading data.

Moreover, according to the embodiment of the present invention, since the threshold voltage of the transistor that performs the precharge is made less compared to the transistor of the data I/O line switch, it is possible to lower the precharge voltage by the amount of the abovementioned threshold voltage, and it is possible to achieve both an increase in the data reading speed and lower power consumption as described above.

The explanation was given above using DRAM as an example, but the present invention can be widely applied to general semiconductor devices that use an amplifier circuit that performs precharging.

Accordingly, while the preferred embodiment of the invention have been described and illustrated above, it should be understood that it is exemplary of the invention and is not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
a data amplifier that amplifies a voltage differential of a data I/O line pair and outputs data that has been read to an output buffer;
a data I/O line switch that controls connection and disconnection between the data I/O line pair and the data amplifier;
an I/O line precharge circuit that precharges a first portion of the data I/O line pair, wherein the first portion of the data I/O line pair is separated by the data I/O line switch and located not on the side of the data amplifier;
an amplifier precharge circuit that precharges a second portion of the data I/O line pair, the second portion of the data I/O line pair is separated by the data I/O line switch and located on the side of the data amplifier;
a column decoder that generates a column selecting signal that selects a bit line pair from among a plurality of bit line pairs to which memory cells are connected according to a column address that is input; and
a bit line selecting switch that connects, according to the column selecting signal, the bit line pair of a plurality of the bit line pairs and a data I/O line pair that outputs data from a memory cell to the outside.

2. The semiconductor device according to claim 1 wherein, during a data reading period, the I/O line precharge circuit performs precharging of the first portion of the data I/O line pair in a period in which both of the bit line selecting switch and the data I/O line switch are in the OFF state.

3. The semiconductor device according to claim 1 wherein, during a data reading period, the amplifier precharge circuit performs precharging of the second portion of the data I/O line pair in a period in which the data I/O line switch is in the OFF state, and the bit line selecting switch is in the ON state.

4. The semiconductor device according to claim 1, further comprising:
a write amplifier that is connected to the second portion of the data I/O line pair and amplifies data that is input when writing to the memory cell,
wherein, during a data writing period, the I/O line precharge circuit performs precharging of the first portion of the data I/O line pair in a period in which the write amplifier is in the enabled state, and the data I/O line switch is in the OFF state.

5. The semiconductor device according to claim 1, wherein in the I/O line precharge circuit, a threshold voltage of a transistor that precharges the first portion of the data I/O line pair is set low compared to a threshold voltage of a transistor of the data I/O line switch.

6. The semiconductor device according to claim 1, wherein in the amplifier precharge circuit, a threshold voltage of a transistor that precharges the second portion of the data I/O line pair is set low compared to a threshold voltage of a transistor of the data I/O line switch.

7. The semiconductor device according to claim 1, wherein the precharge voltage that is precharged by the I/O line precharge circuit or the amplifier precharge circuit is set lower than the power supply voltage that is supplied from an external source.

8. A semiconductor device, comprising:
a first line;
a second line provided separately from the first line;
a switch circuit provided between the first line and the second line, the first and second lines being electrically disconnected from each other when the switch circuit is turned OFF and electrically connected to each other when the switch circuit is turned ON;
a first precharge circuit coupled to the first line to precharge, when activated, the first line;
a second precharge circuit coupled to the second line to precharge, when activated, the second line; and
an amplifier circuit coupled to the second line,
wherein the first precharge circuit being activated and the second precharge circuit being deactivated when the switch circuit is turned OFF and the amplifier circuit is activated, and the first precharge circuit being deactivated and the second precharge circuit being activated when the switch circuit is turned OFF and the amplifier circuit is deactivated.

9. The semiconductor device according to claim 8, further comprising:
a third line; and
a fourth line provided separately from the third line,
wherein the switch circuit is provided between the third line and the fourth line, the first precharge circuit is coupled to the third line, the second precharge circuit is coupled to the fourth line, and the amplifier circuit is coupled to the fourth line.

10. The semiconductor device according to claim 8, wherein the first precharge circuit is deactivated when the switch circuit is turned ON, and the amplifier circuit is activated.

11. The semiconductor device according to claim 8, wherein the second precharge circuit is deactivated when the switch circuit is turned ON, and the amplifier circuit is activated.

12. A semiconductor device, comprising:
first and second bit lines;
a sense amplifier circuit coupled to the bit lines to amplify a voltage difference between the first and second bit lines;
first and second I/O lines;
a bit line selecting switch provided between the first and second bit lines and the first and second I/O lines, and controlling connection and disconnection between the first and second I/O lines and the first and second bit lines;
an I/O precharge circuit coupled to the first and second I/O lines to precharge each of the first and second I/O lines;
a data amplifier circuit including first and second nodes to amplify a voltage difference between the first and second nodes;
a data I/O line switch provided between the first and second I/O lines and the first and second nodes of the data amplifier circuit, and controlling connection and disconnection between the first and second nodes and the first and second I/O lines; and
an amplifier precharge circuit coupled to the first and second nodes of the data amplifier circuit to precharge each of the first and second nodes.

13. The semiconductor device according to claim 12, wherein the first and second I/O lines include first and second local I/O lines and first and second data I/O lines respectively, the bit line selecting switch being provided between the first and second bit lines and the first and second local I/O lines, the data I/O line switch being provided between the first and second I/O lines and the first and second nodes of the data amplifier circuit, the semiconductor device further comprising a third switch circuit provided between the first and second local I/O lines and the first and second data I/O lines.

14. The semiconductor device according to claim 12, wherein the first precharge circuit precharges each of the first and second data I/O lines at a first voltage, and the second precharge circuit precharges each of the third and fourth data I/O lines at a second voltage which is substantially the same as the first voltage.

15. The semiconductor device according to claim 12, wherein the first precharge circuit includes a first transistor, and the second precharge circuit includes a second transistor, which is larger in threshold voltage than the first transistor.

16. The semiconductor device according to claim 15, wherein the second precharge circuit includes a third transistor, which is substantially the same in threshold voltage as the first transistor.

17. The semiconductor device according to claim 16, wherein each of the first, second, and third transistors comprises a p-channel type transistor.

* * * * *